(12) United States Patent
Vizbaras et al.

(10) Patent No.: US 11,984,526 B2
(45) Date of Patent: May 14, 2024

(54) OPTICAL DEVICE HAVING AN OUT-OF-PLANE ARRANGEMENT FOR LIGHT EMISSION AND DETECTION

(71) Applicant: Brolis Sensor Technology, UAB, Vilnius (LT)

(72) Inventors: Kristijonas Vizbaras, Vilnius (LT); Augustinas Vizbaras, Vilnius (LT)

(73) Assignee: Brolis Sensor Technology, UAB, Vilnius (LT)

( * ) Notice: Subject to any disclaimer, the term of this patent is extended or adjusted under 35 U.S.C. 154(b) by 0 days.

(21) Appl. No.: 17/782,242

(22) PCT Filed: Dec. 10, 2020

(86) PCT No.: PCT/EP2020/085530
§ 371 (c)(1),
(2) Date: Jun. 3, 2022

(87) PCT Pub. No.: WO2021/116286
PCT Pub. Date: Jun. 17, 2021

(65) Prior Publication Data
US 2023/0006088 A1 Jan. 5, 2023

Related U.S. Application Data

(60) Provisional application No. 62/947,110, filed on Dec. 12, 2019.

(51) Int. Cl.
*H01L 31/173* (2006.01)
*H01L 31/0232* (2014.01)
(Continued)

(52) U.S. Cl.
CPC ...... *H01L 31/173* (2013.01); *H01L 31/02327* (2013.01); *H01L 33/58* (2013.01);
(Continued)

(58) Field of Classification Search
CPC . H01L 31/173; H01L 31/02327; H01L 33/58; H01L 31/03042; H01L 31/03046;
(Continued)

(56) References Cited

U.S. PATENT DOCUMENTS 4,293,826 A 10/1981 Scifres et al.
4,431,258 A 2/1984 Fye
(Continued)

FOREIGN PATENT DOCUMENTS

CA 2177787 A1 3/1997
CN 101356699 A 1/2009
(Continued)

OTHER PUBLICATIONS

International Search Report and Written Opinion dated Mar. 16, 2021 in PCT/EP/2020/085530, 12 pages.
(Continued)

*Primary Examiner* — Tony Ko
(74) *Attorney, Agent, or Firm* — Goodwin Procter LLP

(57) ABSTRACT

A solid-state device, and use and formation thereof. The device includes a light emitter (102) that emits light with abeam propagation direction and includes an emitter epitaxial layer stack (940); a light routing medium (103) in optical communication with the light emitter; and a light detector (104) in optical communication with the light routing medium, which detects light emitted by the light emitter and includes a detector epitaxial stack (945). The light emitter and detector are monolithically formed on a semiconductor substrate. The emitter and detector epitaxial layer stacks include different pluralities of layers of a single epitaxial layer stack. The beam propagation direction is either in-plane with the single epitaxial layer stack and the light detector detects light out of plane with the single epitaxial layer stack, or out of plane with the single epitaxial (Continued)

layer stack and the light detector detects light in plane with the single epitaxial layer stack.

21 Claims, 10 Drawing Sheets

(51) Int. Cl.
| | | |
|---|---|---|
| *H01L 33/58* | (2010.01) | |
| *H01S 5/026* | (2006.01) | |
| *G02B 6/12* | (2006.01) | |
| *H01L 31/0304* | (2006.01) | |
| *H01L 31/101* | (2006.01) | |
| *H01L 33/00* | (2010.01) | |
| *H01L 33/30* | (2010.01) | |
| *H01S 5/183* | (2006.01) | |
| *H01S 5/34* | (2006.01) | |
| *H01S 5/343* | (2006.01) | |

(52) U.S. Cl.
CPC .............. *H01S 5/0264* (2013.01); *G02B 6/12* (2013.01); *H01L 31/03042* (2013.01); *H01L 31/03046* (2013.01); *H01L 31/101* (2013.01); *H01L 33/0025* (2013.01); *H01L 33/0045* (2013.01); *H01L 33/30* (2013.01); *H01S 5/183* (2013.01); *H01S 5/3402* (2013.01); *H01S 5/34353* (2013.01)

(58) Field of Classification Search
CPC .............. H01L 31/101; H01L 33/0025; H01L 33/0045; H01L 33/30; H01L 31/125; H01L 33/0062; H01L 25/167; H01S 5/0264; H01S 5/183; H01S 5/3402; H01S 5/34353; H01S 5/0239; G02B 6/12; G02B 6/12004
See application file for complete search history.

(56) References Cited

U.S. PATENT DOCUMENTS

| | | | |
|---|---|---|---|
| 5,047,845 | A | 9/1991 | Tomlinson et al. |
| 5,748,653 | A | 5/1998 | Parker et al. |
| 5,959,318 | A | 9/1999 | Shim et al. |
| 6,347,104 | B1 | 2/2002 | Dijaili et al. |
| 6,597,713 | B2 | 7/2003 | Ouchi |
| 6,605,828 | B1 | 8/2003 | Schwarzrock et al. |
| 6,909,554 | B2 | 6/2005 | Liu et al. |
| 6,940,885 | B1 | 9/2005 | Cheng et al. |
| 7,161,582 | B2 | 1/2007 | Bathiche et al. |
| 7,244,923 | B2 | 7/2007 | Song et al. |
| 7,518,170 | B2 | 4/2009 | Etoh |
| 7,569,860 | B2 | 8/2009 | Behfar et al. |
| 7,598,527 | B2 | 10/2009 | Behfar et al. |
| 7,633,081 | B2 | 12/2009 | Bakkers et al. |
| 7,633,614 | B2 | 12/2009 | Haugholt et al. |
| 7,824,937 | B2 | 11/2010 | Suehiro et al. |
| 7,960,225 | B1 | 6/2011 | Morita et al. |
| 8,005,125 | B2 | 8/2011 | Yang |
| 8,011,810 | B2 | 9/2011 | Ma et al. |
| 8,227,082 | B2 | 7/2012 | Goyal |
| 8,405,016 | B2 | 3/2013 | Oshiyama et al. |
| 8,587,040 | B2 | 11/2013 | Kobayashi et al. |
| 8,759,742 | B2 | 6/2014 | Yokogawa |
| 9,006,807 | B2 | 4/2015 | Inoue et al. |
| 9,293,499 | B2 | 3/2016 | Mase et al. |
| 9,337,364 | B2 | 5/2016 | Masuda et al. |
| 9,389,732 | B2 | 7/2016 | Craven-Bartle |
| 9,490,239 | B2 | 11/2016 | Schubert et al. |
| 9,645,375 | B2 | 5/2017 | Kleppe et al. |
| 9,678,277 | B2 | 6/2017 | Zhou et al. |
| 9,684,140 | B2 | 6/2017 | Zhang |
| 9,887,219 | B2 | 2/2018 | Sano et al. |
| 9,929,530 | B2 | 3/2018 | Suzuki et al. |
| 9,971,106 | B2 | 5/2018 | Morioka |
| 10,429,289 | B2 | 10/2019 | Knox et al. |
| 2001/0032987 | A1 | 10/2001 | Narui et al. |
| 2002/0074553 | A1 | 6/2002 | Starikov et al. |
| 2002/0171092 | A1 | 11/2002 | Goetz et al. |
| 2004/0022282 | A1 | 2/2004 | Lano et al. |
| 2004/0120684 | A1 | 6/2004 | Ishibashi et al. |
| 2006/0118893 | A1* | 6/2006 | Behfar ................. G02B 6/4214 257/E31.022 |
| 2006/0124829 | A1 | 6/2006 | Song et al. |
| 2007/0205488 | A1 | 9/2007 | Hirai et al. |
| 2016/0020236 | A1 | 1/2016 | Tanaka et al. |
| 2017/0084775 | A1 | 3/2017 | Li et al. |
| 2019/0331473 | A1 | 10/2019 | Johnson et al. |

FOREIGN PATENT DOCUMENTS

| | | |
|---|---|---|
| CN | 101598273 A | 12/2009 |
| CN | 102183828 A | 9/2011 |
| EP | 0772269 A1 | 5/1997 |
| EP | 1060541 A1 | 12/2000 |
| GB | 2378069 | 1/2003 |
| JP | 4419662 B2 | 2/2010 |
| JP | 4477151 B2 | 6/2010 |
| JP | 4667408 B2 | 4/2011 |
| JP | 2011155248 A | 8/2011 |
| JP | 4942283 B2 | 5/2012 |
| JP | 2012169673 A | 9/2012 |
| JP | 2014060258 A | 4/2014 |
| JP | 2015220255 A | 12/2015 |
| JP | 6507967 B2 | 5/2019 |
| WO | WO-1991002391 A1 | 2/1991 |
| WO | WO-2013161722 A1 | 10/2013 |
| WO | WO-2015057771 A1 | 4/2015 |
| WO | WO-2018163850 A1 | 9/2018 |
| WO | WO-2018192689 | 10/2018 |

OTHER PUBLICATIONS

Bortoletto, Daniela, "Solid State Detectors," Elsevier 623(1):35-41 (2010), abstract only.

Shire et al., "Gain Controlled Vertical Cavity Surface Emitting Lasers Coupled with Intracavity In-Plane Lasers," Applied Physics Letters 66(14):1717-1719 (1995).

Yu et al., Small Divergence Edge-Emitting Semiconductor Lasers with Two-Dmensional Plasmonic Colllimators, Applied Physics Letters 93(18):181101-1-181101-3 (2008).

\* cited by examiner

| 507 - contact |
| 506 – graded layer |
| 505 - barrier |
| 504 – graded layer |
| 503 - absorber |
| 502 – graded layer |
| 501 – contact layer |

FIG. 5a

| 1306 - contact |
| 1305 - absorber |
| 1304 – graded layer |
| 1303 - contact |
| 1302 - buffer |
| 1301 – substrate |

FIG. 5b

| 611 - contact |
|---|
| 610 – graded layer |
| 609 – outer waveguide |
| 608 – graded layer |
| 607 – inner waveguide |
| 606 – active region |
| 605 – inner waveguide |
| 604 – graded layer |
| 603 – outer waveguide |
| 602 – graded layer |
| 601 – contact layer |

FIG. 6

| 703 Detector stack |
|---|
| 702 – buffer/graded layer |
| 701 – Substrate |

FIG. 7

| 803 Light emitter layer stack |
|---|
| 802 – buffer/graded layer |
| 801 – Substrate |

FIG. 8

OPTICAL DEVICE HAVING AN OUT-OF-PLANE ARRANGEMENT FOR LIGHT EMISSION AND DETECTION

CROSS-REFERENCE TO RELATED APPLICATIONS

This application is the national stage of International (PCT) Patent Application No. PCT/EP 2020/085530, filed on Dec. 10, 2020, which claims the benefit of, and priority to, U.S. Provisional Application Ser. No. 62/947,110, entitled "Optical Device Having an Out-of-Plane Arrangement For Light Emission and Detection," filed on Dec. 12, 2019, each of which is incorporated herein by reference in its entirety.

FIELD OF THE INVENTION

Embodiments of the invention relate generally to solid state-based optical devices, and particularly to solid state optical devices with monolithic complementary light emitters and detectors in an out-of-plane arrangement for light emission/detection, with at least one detector formed with the light emitter on the same substrate.

Embodiments of the invention are particularly useful when complementary light emitter and detectors are made of III-V semiconductor material, and light routing medium in optical communication with the light emitter and detector is made of group-IV material and functions as a photonic integrated circuit. Such a hybrid combination of III-V devices and group-IV photonic integrated circuit allows the realization of an ultra-compact integrated optical device that can be used for many applications, such as biosensing (glucose, lactate, ethanol, etc.), LIDAR applications, gas sensing, etc.

BACKGROUND OF THE INVENTION

Compact hybrid optical sensors that can be used to non-invasively measure blood metabolites, such as glucose, lactate, ethanol, urea, etc., have a huge potential for consumer applications, because such integrated sensors have extremely small footprints and are compatible with electronics used in wearable and other smart devices. See, e.g., WO2019/149815 to Vizbaras et al., and WO2018/215388 to Vizbaras, et al. (also U.S. Ser. No. 16/609,355), incorporated herein by reference in their entireties. Entry into the consumer market is facilitated by a sufficiently low cost of goods (COGS).

For example, sensors may include a plurality of III-V light emitters and detectors hybridly integrated into a group-IV photonic integrated circuit to form the sensors. Integration is an expensive step, both in terms of time and money, because it is difficult to avoid serial one-by-one integration of each component. Moreover, such III-V devices are typically made from different epitaxial layer stacks; thus, they are also realized separately.

SUMMARY OF THE INVENTION

Embodiments of the invention enable a significant reduction of the number of discrete components that need to be integrated to form a sensor, thus saving manufacturing time and costs. For example, a conventional sensor may include four light emitters (gain chips), four control detectors, and one signal detector, i.e., nine discrete III-V components that need to be integrated one by one in a serial manufacturing process. Moreover, their respective epitaxial layer stacks are typically grown in separate runs. Embodiments of the current invention, however, may include realizing one of the light sources on the same substrate as all four control detectors, with all of them being hybridly integrated in a single step. Thus the number of epitaxial growth steps for a single sensor are reduced by 20% and the number of components that need to be integrated is reduced by 45.5% (from nine to five), thereby allowing significant reduction of manufacturing costs and increase of overall manufacturing speed.

Compact hybrid optical sensors that can be used to non-invasively measure blood metabolites, such as glucose, lactate, ethanol, urea, etc., are useful for consumer applications, because such integrated sensors have extremely small footprints and are compatible with electronics.

In an aspect, embodiments of the invention relate to a solid-state device including a semiconductor substrate; a solid-state light emitter disposed over the semiconductor substrate, the solid-state light emitter configured to emit light with a beam propagation direction; a light routing medium in optical communication with the solid-state light emitter; and a solid-state light detector disposed over the semiconductor substrate in optical communication with the light routing medium and configured to detect light emitted by the solid-state light emitter. The solid-state light emitter and solid-state light detector are both monolithically formed on the substrate. The solid-state light emitter includes an emitter epitaxial layer stack and the solid-state light detector includes a detector epitaxial layer stack. Each of the emitter epitaxial layer stack and the detector epitaxial layer stack includes a different plurality of epitaxial layers of a single epitaxial layer stack disposed over the semiconductor substrate. The beam propagation direction is (a) in-plane with the single epitaxial layer stack and the solid-state light detector detects light out of plane with the single epitaxial layer stack, or (b) out of plane with the single epitaxial layer stack and the solid-state light detector detects light in plane with the single epitaxial layer stack.

A topmost epitaxial layer of the detector epitaxial stack may be disposed closer to the semiconductor substrate than a topmost epitaxial layer of the emitter epitaxial layer stack. The plurality of epitaxial layers of the emitter epitaxial layer stack may include a first portion of each layer of the single epitaxial layer stack, and the plurality of epitaxial layers of the detector epitaxial stack may consist essentially of a second portion of each layer of a bottommost subset of the single epitaxial layer stack.

A topmost epitaxial layer of the emitter epitaxial layer stack may be disposed closer to the semiconductor substrate than a topmost epitaxial layer of the detector epitaxial layer stack. The plurality of epitaxial layers of the detector epitaxial layer stack may include a first portion of each layer of the single epitaxial layer stack, and the plurality of epitaxial layers of the emitter epitaxial layer stack may consist essentially of a second portion of each layer of a bottommost subset of the single epitaxial layer stack.

The semiconductor substrate, the solid-state light emitter, and the solid-state light detector may each include a III-V semiconductor material, which may include Al, Ga, In, As, Sb, P, N, Bi, and/or alloy combinations thereof. The III-V semiconductor material may include at least one dopant for electrical conductivity.

The single epitaxial layer stack may include a thickness matching layer. The thickness matching layer stack may be disposed above a topmost layer of the emitter epitaxial layer stack or a topmost layer of the detector epitaxial layer stack.

The detector epitaxial layer stack may include:

(i) a first contact layer disposed over the semiconductor substrate and comprising an intentionally highly doped III-V semiconductor layer including p-type or n-type dopants;

(ii) a III-V undoped barrier layer disposed over the first contact layer and configured to block flow of majority carriers of a same type as the dopants and to allow flow of minority carriers of a type opposite from the majority carriers;

(iii) a light absorber layer disposed over the III-V undoped barrier layer and comprising a lightly doped III-V semiconductor layer including dopants of a same type as the dopants of the first contact layer; and (iv) a second contact layer disposed over the light absorber layer and comprising a second highly doped III-V semiconductor layer including p-type or n-type dopants.

The first and second contact layers may include a same type of dopants and/or different types of dopants.

The detector epitaxial layer stack may include:

(i) a first contact layer comprising an intentionally highly doped III-V semiconductor layer including p-type or n-type dopants;

(ii) an light absorber layer comprising an undoped III-V semiconductor layer; and (iii) a second contact layer comprising a second highly doped III-V semiconductor layer including p-type or n-type dopants.

The first and second contact layers include different types of dopants.

The emitter epitaxial layer stack may include an active region including a III-V semiconductor layer stack including a III-V semiconductor alloy layer disposed between two III-V semiconductor alloy layers of a different composition, with the active region being configured to generate light by at least one of recombination or relaxation.

The semiconductor substrate may be a III-V semiconductor substrate that is intentionally undoped, semi-insulating, and/or electrically conductive and doped with p- or n-type impurities. The single epitaxial layer stack may include a III-V semiconductor graded layer including compositional grading and/or dopant concentration grading.

The III-V semiconductor graded layer may provide smooth conductance and valence band transition to an adjacent layer.

The light routing medium may be solid state; it may include at least one group IV element.

In another aspect, embodiments of the invention relate to a method for detecting light in a solid-state device. The method includes emitting a light beam by a solid-state light emitter; and propagating the light through a light routing medium to a solid-state light detector. The solid-state light emitter and solid-state light detector are both monolithically formed on a substrate. The solid-state light emitter includes an emitter epitaxial layer stack and the solid-state light detector includes a detector epitaxial layer stack. Each of the emitter epitaxial layer stack and the detector epitaxial layer stack includes a different plurality of epitaxial layers of a single epitaxial layer stack disposed over the semiconductor substrate. The beam propagation direction is (a) in-plane with the single epitaxial layer stack and the solid-state light detector detects light out of plane with the single epitaxial layer stack, or (b) out of plane with the single epitaxial layer stack and the solid-state light detector detects light in plane with the single epitaxial layer stack.

In still another aspect, embodiments of the invention relate to a method of forming a solid-state device. The method includes forming a single epitaxial layer stack over a semiconductor substrate. A solid-state light emitter and solid-state light detector are monolithically formed on the semiconductor substrate from the single epitaxial layer stack, the solid-state light emitter including an emitter epitaxial layer stack and the solid-state light detector including a detector epitaxial layer stack, with each of the emitter epitaxial layer stack and the detector epitaxial layer stack including a different plurality of epitaxial layers of the single epitaxial layer stack. A light routing medium in optical communication with the solid-state light emitter and solid-state light detector is formed. The solid-state light emitter is configured to emit light with a beam propagation direction. The solid-state light detector is configured to detect light emitted by the solid-state light emitter. The beam propagation direction is (a) in-plane with the single epitaxial layer stack and the solid-state light detector detects light out of plane with the single epitaxial layer stack, or (b) out of plane with the single epitaxial layer stack and the solid-state light detector detects light in plane with the single epitaxial layer stack.

BRIEF DESCRIPTION OF DRAWINGS

FIG. 5a is a schematic diagram of the key functional blocks of a detector structure, in accordance with an embodiment of the invention;

FIG. 5b is a schematic layer structure of a PIN detector, in accordance with an embodiment of the invention;

FIG. 6 is a schematic diagram of the key functional blocks of a light emitter/gain structure, in accordance with an embodiment of the invention;

FIG. 7 is a schematic diagram of a layer structure in which an additional buffer/graded layer is incorporated to provide relaxation when the substrate and epitaxial layer structures are lattice mismatched, with the detector being grown first, in accordance with an embodiment of the invention;

FIG. 8 is a schematic diagram of a layer structure in which an additional buffer/graded layer is incorporated to provide relaxation when the substrate and epitaxial layer structures are lattice mismatched, with the light emitter being grown first, in accordance with an embodiment of the invention;

DETAILED DESCRIPTION

Many different applications can benefit from ultra-compact light-based sensors that are non-invasive, non-destructive and very sensitive. See Werle et al., "Near- and mid-infrared laser-optical sensors for gas analysis," Optics and Lasers in Engineering 17 (2002) 101-114, incorporated herein by reference in its entirety. Such applications include non-invasive sensing through skin, gas sensing, stand-off detection, etc. See, e.g., WO 2019/149815. Devices that are semiconductor technology compatible are especially desirable, as they can be made very compact and are mass-market scalable. In such a case, complementary light emitter and detector layer stacks can be epitaxially grown using well-known techniques such as molecular beam epitaxy (MBE) or metal-organic vapor phase epitaxy (MOVPE) from III-V semiconductor material, including group-III chemical elements, such as Al, Ga, In, group-V elements, As, Sb, Bi, P, N and/or alloy combinations thereof. Integrated photonic circuits, such as group-IV-based circuits, can be used as ultra-compact light routing media. See Vizbaras, et al., WO 2018/215388.

Figure 1:
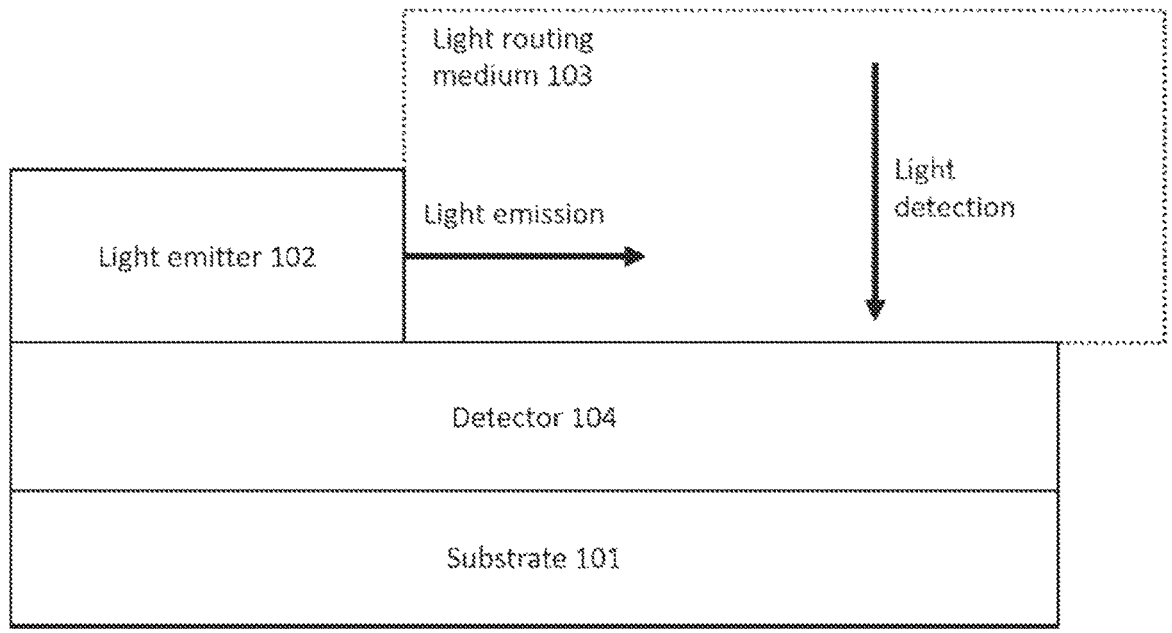
FIG. 1 is a schematic diagram of the main functional blocks of a complementary structure, in which a solid-state light emitter is edge emitting and a solid-state detector collects light in an out-of-plane arrangement via a light routing medium, in accordance with an embodiment of the invention.
Figure 2:
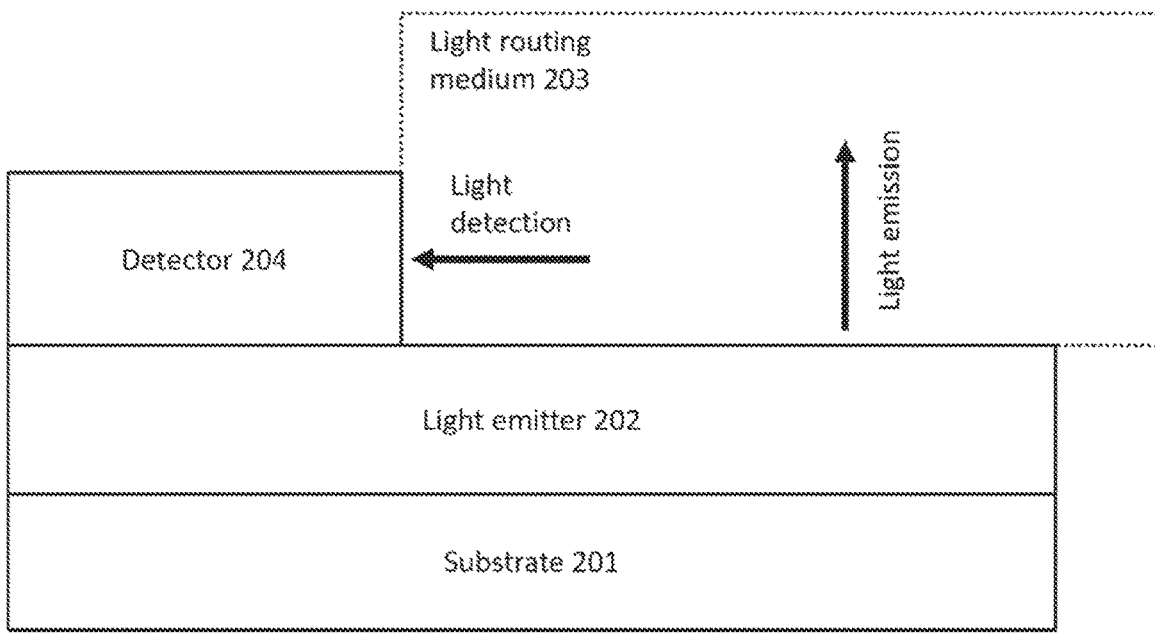
FIG. 2 is a schematic diagram of the main functional blocks of a complementary structure, in which a light emitter is vertically emitting (out-of-epitaxial layer plane) and light detection happens in-plane with the epitaxial layers, via a light routing medium, in accordance with an embodiment of the invention.
Figure 3:
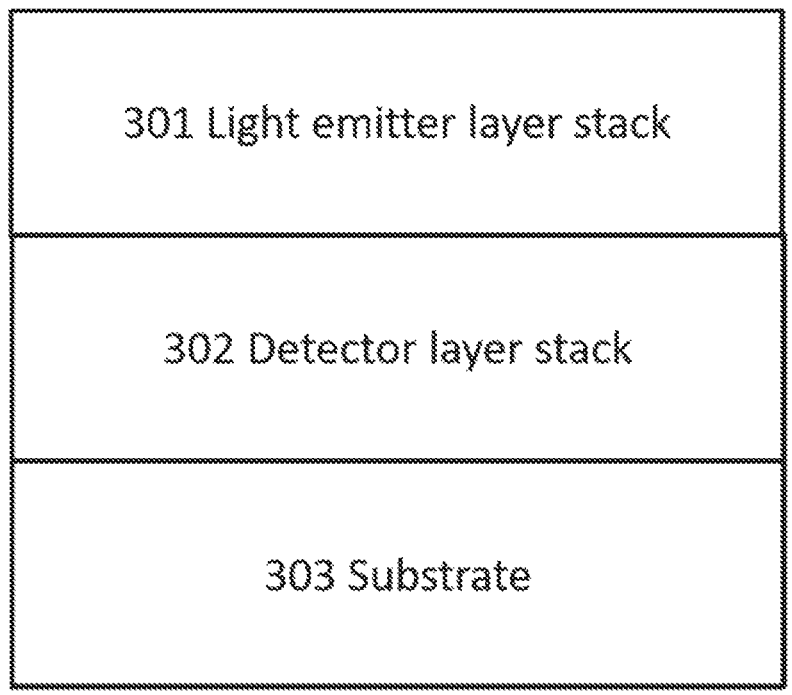
FIG. 3 is a schematic diagram of detector and emitter layer stacks realized on the same substrate, with complementary devices being formed from III-V semiconductor layers, in accordance with an embodiment of the invention.
Figure 4:
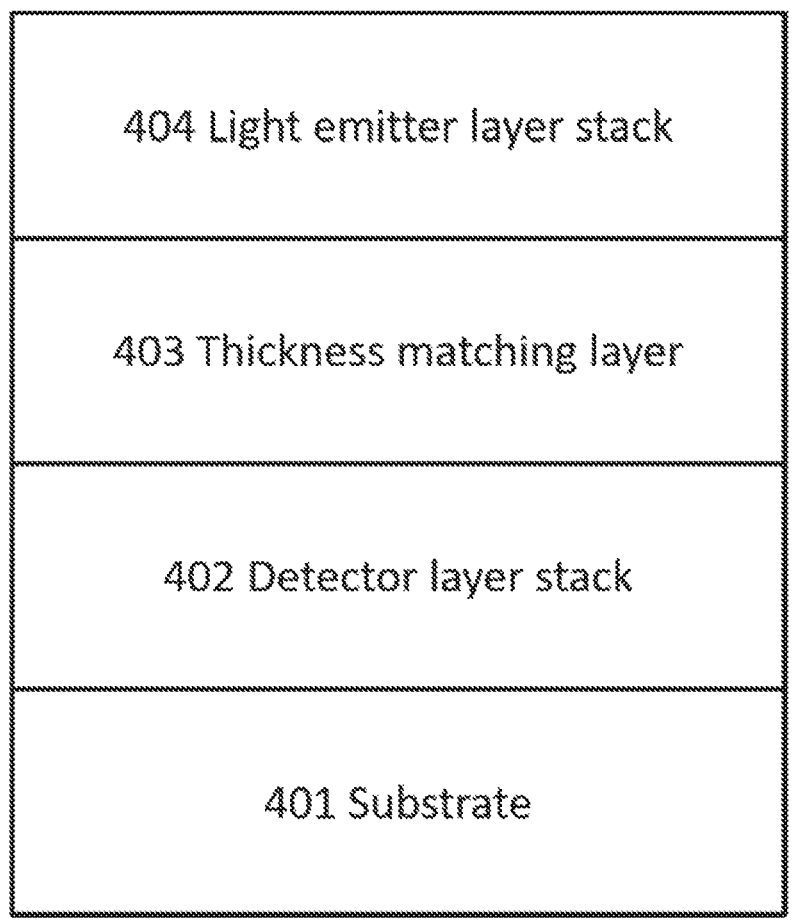
FIG. 4 is a schematic diagram of detector and emitter layer stacks and a thickness matching layer therebetween, realized on the same substrate, in which complementary devices are made from III-V semiconductor layers and the heights of the devices match the heights of light waveguiding structures in group-IV integrated circuits, in accordance with an embodiment of the invention.

Embodiments of the invention include a monolithic complementary light emitting and detecting device with an out-of-plane arrangement for light emission and detection, realized on the same substrate and in optical communication via light routing media (FIGS. 1 and 2). The light emitting device and light detecting device can be made from III-V semiconductor material, in the form of epitaxially grown layer stacks, each layer stack including a different plurality of layers of a single layer stack grown on the same III-V semiconductor substrate. The sequence in which the stacks are grown on the substrate can vary and depends on the final application (FIGS. 3 and 4). Light is emitted from the emitter layer stack and detected in the detector layer stack in an-out of plane arrangement. The epitaxial layer stacks may be grown by standard existing semiconductor device fabrication techniques, well known to people skilled in the art of III-V semiconductor devices. The exact layer stacks, device type, geometry and functional elements depend on the desired application and performance related variables; regardless of the application, embodiments of the invention enable light emission from a light emitter and light detection by the detector medium to take place in an-out-of-plane arrangement.

Referring to FIG. 1, a semiconductor substrate 101 may be a III-V wafer, e.g., a GaAs wafer. The light emitting medium may be an edge-emitting light emitter 102 (gain-chip, light emitting diode, laser diode, etc.) formed over the substrate 101. The emitter 102 may have a light emission direction profile in-plane with the emitter epitaxial layer stack from which it is formed. A detector 104 may be formed from a detector epitaxial layer stack in including a plurality of layers different from those of the emitter layer stack. The detector and emitter epitaxial layer stacks are each formed, as discussed below, from a single epitaxial layer stack grown on the semiconductor substrate. The detector layer stack is fabricated to collect light out-of-plane with respect to the epitaxial layer plane and light emitter emission direction. Light routing medium 103 enables light communication between the emitter 102 and the detector 104. Light routing medium 103 may be any medium that allows at least part of the light from the emitter to reach the detector, e.g., an integrated photonic circuit also formed on the semiconductor substrate 101.

Referring to FIG. 2, in some embodiments, the light emitter 202 is vertically emitting (e.g., vertical cavity surface emitting laser (VCSEL), light emitting diode, etc.). Thus, the light emission direction is perpendicular to the emitter epitaxial layers from which the emitter is formed. The detector 204 epitaxial layer stack is fabricated such that light is collected in-plane. Light routing medium 203 enables light communication between the emitter 202 and the detector 204. Thus, light routing medium 203 allows at least part of the light from emitter to reach the detector. The layer stacks defining both the emitter and detector are each formed from different portions of a single epitaxial layer stack grown on the same substrate 201.

Referring to FIG. 3, a single epitaxial layer stack 300 may be grown in a single epitaxial growth step to form the layers of both the light-emitter and detector layer stacks. In the illustrated embodiment, the active layers of the gain layer stack are disposed above the layers of the detector layer stack, and are grown in the same epitaxial growth step, one on top of the other. In the illustrated embodiment, the active layers of the detector layer stack are grown first, followed by the active layers of the light emitter layer stack, which serves as a light emitter. In a finished solid-state device formed from the illustrated layer structure, the detector includes only the layers of the detector layer stack. The light emitter will include the emitter layer stack disposed over layers of the single epitaxial layer stack corresponding to the layers of the detector layer stack. The exact sequence, including whether the active layers of the emitter layer stack or the detector layer stack are grown first, depends on the end use of the device and final system design.

Epitaxial layer structures may tailored to fabricate devices with a desired geometry to facilitate integration with light routing media requirements. For example, light routing media may be realized using a semiconductor on insulator (SOI) platform (e.g., buried oxide technology). Accordingly, the functional routing blocks, such as spot-size converters, interferometers, filters, splitters, mirrors, rings, etc., are typically made at a certain depth from the surface (e.g., few micrometers). These functional blocks may require a complementary light emitter-detector pair have an additional thickness matching layer (403 in FIG. 4) to enable efficient light coupling into the routing medium. This thickness matching layer may be formed in the same epitaxial growth run on the same substrate 401, i.e., during the formation of the single epitaxial layer stack, between the detector and light emitter layer stacks 402, 404.

In an embodiment, an edge emitting device may be monolithically paired with a vertically detecting detector. Referring to FIG. 5a, the detector functional layers may be as follows. A single epitaxial layer stack is formed on a III-V semiconductor substrate. A bottom portion of the single epitaxial layer stack includes the detector epitaxial layer stack. A lattice matched (or pseudomorphically strained) contact layer 501 is disposed over the substrate (not shown).

A graded layer 502 is disposed over the contact layer 501. The graded layer is compositionally and/or electrically graded. Compositional grading includes varying a ratio of layer constituents. For example in a III-V layer including $Al_{0.1}Ga_{0.9}As_{0.05}Sb_{0.95}$, the weight % of Al may be increased throughout a layer to $Al_{0.5}Ga_{0.5}As_{0.05}Sb_{0.95}$. Electrical grading includes the incorporation of an electrically active impurity concentration profile to provide smooth transition for carrier transport and reduce band spikes at heterointerfaces.

A thick bulk layer is disposed over the graded layer 502. The bulk layer functionally serves as a light absorber 503.

A second graded layer 504 is disposed over the light absorber layer 503. The second graded layer 504, which is compositionally and/or electrically graded to the next, higher bandgap layer. The higher bandgap layer disposed over the second graded layer 504 serves as a functional barrier layer 505, blocking majority carrier transport to the overlying contact.

A third graded layer 506 (electrically and/or compositionally graded) can be grown over the barrier layer 505.

An intentionally doped contact layer 507 is disposed over the third graded layer 506.

Each of these layers may be formed by epitaxial layer growth, e.g., in a molecular beam epitaxy reactor, for example, Veeco Gen 200 Edge, fitted with required source materials to form needed alloys.

All of the doped layers in the embodiment describe with reference to FIG. 5 have the same type of conductivity and, thus, the illustrated detector layer structure may serve as a possible unipolar barrier-detector heterostructure.

Another embodiment of a detector heterostructure is a bipolar PIN detector. Referring to FIG. 5b, an example of functional PIN detector layers is as follows: on an n-doped III-V semiconductor substrate 1301, a lattice matched, highly n-doped buffer 1302 and contact 1303 layers are disposed, followed by a n-doped graded 1304 layer, which is compositionally graded from contact layer to a nominally undoped (intrinsic) absorber layer 1305. This, in turn, is followed by a p-doped contact layer 1306.

Each of these layers may be formed by epitaxial layer growth, e.g., in a molecular beam epitaxy reactor, for example, Veeco Gen 200 Edge, fitted with required source materials to form needed alloys.

The emitter heterostructure can be realized directly on top of the detector, i.e., the functional layers of the emitter may be disposed over the functional layers of the detector. One example of an emitter layer stack with its functional layers is depicted in FIG. 6. The functional emitter layers include a contact layer 601, e.g., a back contact layer, which in some embodiments may be the same as the intentionally doped contact layer 507 in the detector stack, or a layer with a different composition/doping/thickness on top of contact layer 507.

A graded layer 602 is disposed over the emitter back contact layer. The graded layer 602 is compositionally graded to a higher bandgap outer waveguide layer 603 disposed thereover, which serves as a cladding layer.

A graded layer 604 is disposed over the outer waveguide layer 603. The graded layer 604 is compositionally and electrically graded to a waveguide layer 605, which functionally serves as the optical mode confinement layer.

The inner waveguide layer 605 is followed by an active region layer stack 606. In a bipolar device, the active region layer stack 606 may include a set of N+1 quantum wells, with N being a non-negative integer, embedded between different material layers, which provide carrier confinement for both holes and electrons (spatially overlapping in case of type-I band alignment and spatially separated for type-II band alignment). In the case of an interband quantum cascade active region, separate stages with type-III band alignment in the active region can also be present.

In some embodiments, the light emitter may be a unipolar device, such as a quantum cascade laser, with the active region layer stack 606 including a plurality of thin alternating layers, creating intersubband bands, where electron transport and radiative transitions take place.

The active region can then be followed by a waveguiding layer 607, which confines the optical mode in the active region layer stack 606.

The waveguiding layer 607 may be followed by a graded layer 608. The graded layer 608 is compositionally and/or electrically graded to the next, higher bandgap, outer waveguide layer 609, which also serves as an optical cladding layer.

A graded layer 610 is disposed over the outer waveguide layer 609. The graded layer 610 is compositionally and/or electrically graded to the next layer, i.e., contact layer 611.

In some embodiments, between contact layer 601 and intentionally doped contact layer 507, if necessary, a thickness matching layer 403 may be inserted, as depicted in FIG. 4. A thickness matching layer may be used when, e.g., emitter/detectors are formed from III-V semiconductor layers, and a height of the structures needs to match light waveguiding structures in group IV integrated circuits.

Referring to FIGS. 7 and 8, in some embodiments, heterostructures described herein can be grown on lattice mismatched substrates and additional buffer/graded layers 702, 802 may be included to reduce formation of crystal dislocations and the resulting negative effects of such dislocations.

Figure 9:
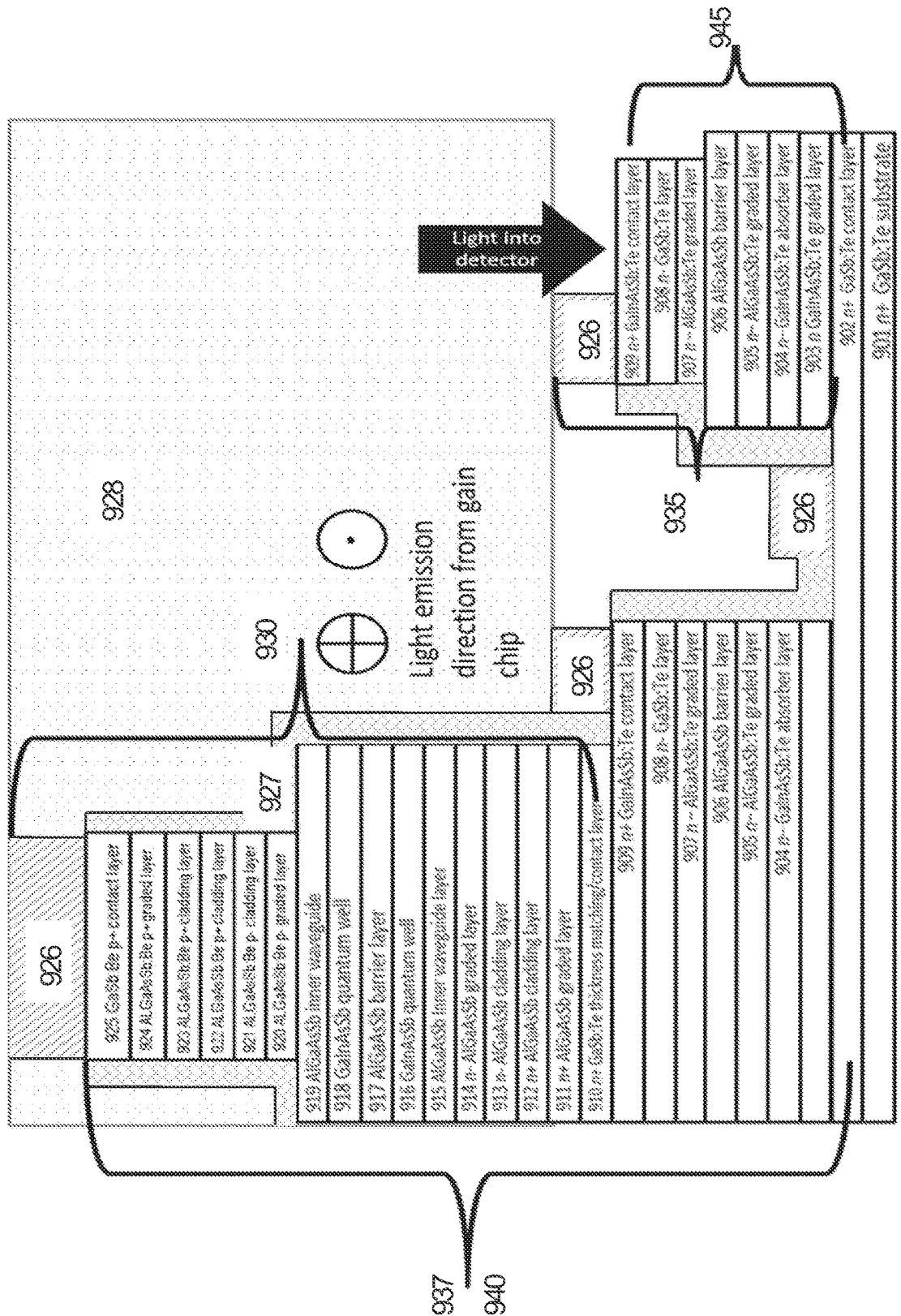
FIG. 9 a schematic cross-sectional view of an edge-emitting light emitter and vertically detecting photodetector structure, with indications of possible alloys, insulation and metallization, for a structure designed to emit and detect light, centered around 2200 nm, at room temperature, in accordance with an embodiment of the invention.

One way of fabricating the above mentioned complex heterostructure is depicted in FIG. 9. Here, by standard semiconductor fabrication techniques, the heterostructure is structured into the ridge waveguide edge-emitting light emitter, in this particular case a bent waveguide gain chip (e.g., Vizbaras et al., "High power continuous-wave GaSb-based superluminescent diodes as gain chips for widely tunable laser spectroscopy in the 1.05-2.45 µm wavelength range," Applied Physics Letters 107, 011103 (2015), incorporated herein by reference in its entirety) and a set of photodetectors (see FIGS. 9 and 10 and accompanying description). As can clearly be seen in FIGS. 9 and 10, light emission and detection takes place in a non-parallel plane arrangement.

Referring to FIG. 9, a heterostructure, suitable for making a complementary light-emitter and detector, in accordance with an embodiment of the invention and usable for sensing applications such as transdermal lactate sensing, described in, e.g., WO2019/149815 and WO2018/215388, may include the following layer structure, in the indicated order. Exemplary doping, composition, and thickness values are indicated. Many variations of suitable layer structures are possible, and are apparent to one of skill in the art, based on the instant disclosure.

Substrate 901: As a substrate, a highly n-doped ($5 \times 10^{17}$ cm$^{-3}$ doped with Te as an impurity atom) GaSb substrate may be used. Typically, highly Te doped GaSb substrates provide low defect densities and are a good choice for electrical contacts, if this is necessary. Te is a typical n-type dopant material in the Sb-based material systems.

Contact layer 902: Highly n-doped Te doped ($3 \times 10^{18}$ cm$^{-3}$) 200 nm thick GaSb contact layer. Here, 200 nm is a typical contact layer thickness, which is sufficient to provide the necessary current spreading across the needed contact area. If the contact layer 902 also has to serve as a buffer layer, then to reduce the effect of substrate defects on the device's optical quality, the thickness may need to increase to 2000 nm or even more.

Graded layer 903: 400 nm thick $Ga_{0.80}In_{0.20}As_{0.175}Sb_{0.829}$ one-step graded layer, serving as a transition from GaSb to the absorber layer 904 in terms of doping and composition, with an intermediate doping concentration between contact layer 902 and absorber 904 enabling smoother conduction and valence band transition to absorber layer 904. N-type doping may be $3 \times 10^{17}$ cm$^{-3}$.

Absorber layer 904: 2600 nm thick $Ga_{0.80}In_{0.20}As_{0.175}Sb_{0.829}$ absorber layer, designed in such a way, that light absorption is most efficient in the wavelength range 2.0-2.5 µm. The absorber may be very lightly n-doped with Te ($3 \times 10^{15}$ cm$^{-3}$), to shift the Fermi level from a midgap position towards the conduction band and reduce mid-gap defect related parasitic recombination effects (Shockley-Reed-Hall recombination). The thickness of the absorber is chosen such that light of desired wavelength is efficiently absorbed and converted into a photocurrent.

Electrically graded layer 905: Electrical graded layer 905, includes $Al_xGa_{1-x}As_ySb_{1-y}$, where x varies in the range from 0.05 to 0.25 and represents Al to Sb ratio in the alloy and y varies in the range from 0.01 to 0.02 and represents As to Sb ratio in the quaternary alloy. The electrical graded layer 905, in terms of Al composition, is graded from 5% to 25%, while maintaining lattice matching to the GaSb substrate by changing As—Sb ratio, accordingly. A total thickness of the graded layer is 50 nm.

One way to achieve the compositional grading is by forming a digital alloy from a short period superlattice of GaSb and $AlAs_{0.08}Sb_{0.92}$ (lattice matched composition), where, for example, Al concentration in the formed digital alloy can be calculated from the thickness ratios of the superlattice layers $$x(Al) = \frac{d(AlAsSb)}{d(AlAsSb) + d(GaSb)}$$

Therefore, if the short-period superlattice period is 2 nm, 5% Al composition is represented by 0.1 thick $AlAs_{0.08}Sb_{0.92}$ layer in the superlattice, where GaSb layer is 1.9 nm thick. If the short period superlattice period is 2 nm, then the overall compositionally graded layer 905 can include 25 grading steps, if desired. The electrical graded layer is also doped lightly with Te, nominally $5 \times 10^{15}$ cm$^{-3}$.

Barrier layer 906: the electrically graded layer 905 is followed by an $Al_{0.25}Ga_{0.75}As_{0.02}Sb_{0.98}$ 70 nm thick, nominally undoped barrier layer 906, serving as a barrier for majority carriers. The choice of barrier layer material depends on the conduction and valence band offset. Ideally, if the majority carriers are electrons, then the conduction band offset is high enough to block their flow to the contact, whereas the valence band offset is preferably small enough to allow minority carrier (hole) flow to the contact. The thickness is chosen to be sufficiently thick to render tunneling negligible.

Lightly n-doped graded layer 907: a 50 nm thick, lightly n-doped graded layer 907, includes $Al_xGa_{1-x}As_ySb_{1-y}$, where x varies in the range from 0.05 to 0.25 and represents Al to Sb ratio in the alloy and y varies in the range from 0.01 to 0.02 and represents As to Sb ratio in the quaternary alloy. Here, Al composition is graded from 0.25 to 0.05 and As is varied to maintain lattice matching to the GaSb substrate.

Etch stop layer 908: a 20 nm thick, lightly Te doped ($5 \times 10^{15}$ cm$^{-3}$) 20 nm thick GaSb layer 908, which acts as a selective etch stop layer during the device fabrication step of contact window opening. The thickness is chosen to be sufficient to allow a controllable wet-etch process. Typically, a thickness of 20-50 nm is sufficient, mainly depending on the skill of the operator carrying out the etch process.

Photodetector contact layer 909: an 80 nm thick, heavily Te doped ($1 \times 10^{18}$ cm$^{-3}$) $Ga_{0.80}In_{0.20}As_{0.175}Sb_{0.825}$ photodetector contact layer 909. The contact layer thickness is chosen to be sufficient to allow uniform current spreading within the contact layer and is typically between 20-200 nm. Quaternary GaInAsSb material may be used to make a low-resistive n-type contact.

Thickness matching layer 910: A thickness matching layer 910 is disposed over the photodetector contact layer 909, to ensure hybrid integration accuracy to the group-IV photonic integrated circuit. The layer can be highly Te doped ($3 \times 10^{18}$ cm$^{-3}$), and serve as an n-contact for the light emitter. The thickness of the thickness matching layer 910 depends on the integrated circuit geometry. For example, to couple light efficiently into a silicon waveguide, one must match precisely, i.e., with sub-micrometer precision, the optical mode of the III-V light emitter and the waveguide coupler (e.g., spot-size converter). The depth of the waveguides and other functional silicon blocks depends on the manufacturing platform used (such as a silicon fab process). For example, a fabrication process may result in a buried oxide depth of 2 micrometers from the surface, silicon waveguide thickness of 220 nm and the depth of silicon waveguides of 6.6 micrometers from the surface. The thickness matching layer has to be adjusted in such a manner, that the light emitter active region is matched with a silicon waveguide within several hundreds of nanometers (effectively has to be at 6.6 microns from the surface of silicon integrated circuit). In other fabrication facilities, the thicknesses and depth from surface can be very different, and, therefore, the thickness matching layer 910 needs to be adjusted accordingly.

Graded layer 911: The thickness matching layer 910 is followed by a nominally highly n-type Te doped ($3 \times 10^{18}$ cm$^{-3}$) graded layer, which is 60 nm thick and includes quaternary $Al_xGa_{1-x}As_ySb_{1-y}$ alloy, with linearly graded Al composition from 0.1 to 0.35. The graded layer is made in such manner to provide smoother conduction and valence band transitions between adjacent thickness layer 910 and cladding and waveguide layer 912.

Cladding and waveguide layer 912: The n-graded layer 911 is followed by a 1500 nm thick $Al_{0.45}Ga_{0.55}As_{0.04}Sb_{0.96}$ cladding and waveguide layer 912, Te doped to a nominal level of $3\times10^{17}$ cm$^{-3}$, which serves as a cladding and waveguiding layer. Cladding and waveguide layer serves the function to confine the optical mode to the active region and reduce the possibility of the optical mode leaking into layers below 912. This is ensured by making the layer sufficiently thick. For 2200 nm emission wavelength, the thickness typically is of the order of 1500-2200 nm. The layer is also electrically doped to ensure low resistance at the same time it is important to keep free-carrier losses due to doping sufficiently low.

Outer waveguide layer 913: a 700 nm thick $Al_{0.45}Ga_{0.55}As_{0.04}Sb_{0.96}$ layer, nominally Te doped to $1\times10^{17}$ cm$^{-3}$, serves as an outer waveguide layer for the optical mode. The thickness of this layer is chosen such that 80-95% of the optical mode transmitted through the cladding and waveguide and outer waveguide layers 912, 913 remains in these layers. Accordingly, the outer waveguide layer 913 is lower doped to reduce the arising free-carrier losses.

Compositionally graded layer 914: a lightly Te n-doped $Al_xGa_{1-x}As_ySb_{1-y}$ compositionally graded layer 914 has an Al fraction that is linearly graded from 0.4 to 0.25, with an overall thickness of 100 nm. The graded layer 914 is configured to provide smoother conduction and valence band transitions between adjacent layers, i.e., between outer waveguide layer 913 and inner waveguide layer 915.

Inner waveguide layer 915: a nominally undoped, 420 nm thick $Al_{0.25}Ga_{0.75}As_{0.02}Sb_{0.98}$ inner waveguide layer. Layer 915 is undoped intentionally to avoid losses due to free carrier absorption. The thickness is optimized for desired optical mode and quantum-well (active region) spatial overlap. In this particular example the overlap is 1.4%.

Quantum well layer 916: The inner waveguide 915 also serves as an outer barrier for the next, 13 nm thick, nominally undoped $Ga_{0.7}In_{0.3}As_{0.04}Sb_{0.96}$ quantum well layer 916. Thickness and exact composition are selected to meet the emission wavelength requirements.

Inner barrier layer 917: a 20 nm thick $Al_{0.25}Ga_{0.75}As_{0.02}Sb_{0.98}$ inner barrier layer, separating quantum wells and ensuring carrier localization. Barrier thickness is selected such that wavefunction coupling via the barrier between quantum wells would be negligible, at the same time, desired overlap with optical mode is achieved. The composition is selected to meet the carrier confinement requirements.

Quantum well 918: a second $Ga_{0.7}In_{0.3}As_{0.04}Sb_{0.96}$ quantum well 918 is disposed over the inner barrier layer 917, also 13 nm thick. Here all the functionalities are identical to quantum well layer 916.

P-side waveguide 919: inner $Al_{0.25}Ga_{0.75}As_{0.02}Sb_{0.98}$ p-side waveguide, 420 nm thick. Here, the functionalities are identical to inner waveguide layer 915.

Graded layer 920: a 100 nm thick Be p-doped, $Al_xGa_{1-x}As_ySb_{1-y}$ graded layer 920, where Al is graded from 0.25 to 0.40 and As composition is changed to maintain lattice matching to GaSb substrate. Nominal Be doping is $5\times10^{16}$ cm$^{-3}$. Graded layer 920 is configured to provide smoother conduction and valence band transitions between adjacent layers, i.e., p-side waveguide 919 and p-cladding layer 921.

p-cladding layer 921: a 700 nm thick Be-doped $Al_{0.45}Ga_{0.55}As_{0.04}Sb_{0.96}$ p-cladding layer 921. Nominal doping is $8\times10^{16}$ cm$^{-3}$. The functional purpose of p-cladding layer is identical to that of cladding and waveguide layer 912, only the dopant type differs. The doping level is selected such that free-carrier related and inter-valence band related absorption losses are not elevated.

Highly p-doped cladding layer 922: a 500 nm thick layer of the same composition as p-cladding layer 921, but more highly Be p-doped ($5\times10^{17}$ cm$^{-3}$). The functional purpose of highly p-doped cladding layer 922 is identical to that of p-cladding layer 921, only the doping level is increased as the overlap with optical mode is smaller.

Outer p-type cladding and waveguide layer 923: The outer p-side cladding ends with 1000 nm thick, Be p-doped $Al_{0.45}Ga_{0.55}As_{0.04}Sb_{0.96}$ outer p-type cladding and waveguide layer 923, with nominal doping of $5\times10^{18}$ cm$^{-3}$. The outer P-side cladding and waveguide layer 923 serves to confine the optical mode to the active region and reduces the possibility of the optical mode leaking into layers above, such as into the highly doped graded 924 and contact 925 layers. This is ensured by making the layer sufficiently thick. For 2200 nm emission wavelength, the thickness typically is on the order of 1000-2200 nm. The layer is also electrically doped to ensure low resistance at the same time it is important to keep free-carrier losses due to doping sufficiently low.

Graded layer 924: a 50 nm Be p-doped $Al_xGa_{1-x}As_ySb_{1-y}$ graded layer is put, p-doped to the level of $5\times10^{18}$ cm$^{-3}$. The graded layer 924 is configured to provide smoother conduction and valence band transitions between adjacent layers, i.e., outer p-type cladding and waveguide layer 923 and contact 925.

Contact layer 925: a 100 nm thick, heavily p-doped with Be to the level of $1\times10^{19}$ cm$^{-3}$ GaSb p-contact layer 925. The layer thickness is selected such that homogeneous current spreading is ensured throughout the entire contact are and doping level si made sufficiently high to degenerate the semiconductor and allow the formation of low-resistive ohmic p-side contact.

Metal contacts 926: Metal contacts 926 may be deposited by magnetron sputtering, e-beam evaporation or similar techniques. One typical metal contact stack consists of 5 nm Ti, 50 nm Pt and 300-2000 nm of Au. Ti ensures good sticking to the semiconductor, whereas Pt acts as a diffusion barrier for gold. In general, many different metal layer combinations that allow formation of contacts are known to those of skill in the art.

Dielectric 927: Dielectric layer 927 passivates the devices. A typical dielectric material used for passivation of III-V devices is silicon oxide or silicon nitride. These are deposited by magnetron sputtering, plasma-enhanced-chemical vapor deposition, or other similar techniques. The exact stoichiometry of the dielectric materials is selected based on the refractive index requirements and other required material properties.

The heterostructure in FIG. 9 schematically represents a light emitter (bent-ridge waveguide gain chip) and a complementary photodetector array, epitaxially grown on the same substrate and fabricated into functional complementary devices, emitting and detecting light in an out-of-plane geometry. The complementary devices are fabricated in such a way that they can be flip-chipped and integrated into a specifically etched trench in a group-IV photonic integrated circuit. The thickness of the thickness matching layer 910 is chosen such that light emission is effectively coupled into the group-IV waveguide, when the light emitter is put into the trench and the photodetector array is placed on top of a grating coupler, for light detection.

Accordingly, the solid-state device in FIG. 9 includes a solid-state light emitter 930 and solid-state light detector 935 that are both monolithically formed over the substrate from a single epitaxial layer stack 937. The light emitter and light detector are optically coupled by light routing medium, e.g., a solid-state routing medium 928, which may include at least one group IV element. Solid-state routing medium 928 may be, for example, a photonic integrated circuit, or a set of optical components in any medium able to direct light from emitter to detector.

In the illustrated embodiment, the emitter epitaxial stack 940 includes a first portion of each layer of the single epitaxial layer stack 937, i.e., contact layer 902 through contact layer 925, all disposed over the substrate 901. The emitter epitaxial stack 940 includes both functional emitter layers (i.e., thickness matching/contact layer 910 through contact layer 925) and the remainder layers of the single epitaxial layer stack disposed directly below the functional emitter layers that physically support the functional emitter layers (i.e., contact layer 902 through contact layer 909), functioning as a mechanical substrate for the functional emitter layers. The detector epitaxial stack 945 includes contact layer 902 through contact layer 909, all disposed over the substrate 901.

As illustrated, the topmost epitaxial layer (contact layer 909) of the detector epitaxial layer stack 945 is disposed closer to the semiconductor substrate 901 than the topmost epitaxial layer (contact layer 925) of the emitter epitaxial layer stack 930. This is the case as the emitter epitaxial layer stack 940 includes both the functional emitter layers and the rest of the layers of the single epitaxial layer stack. The latter corresponds to the layers of the detector epitaxial layer stack 945. The plurality of epitaxial layers of the emitter epitaxial layer stack may include a first portion of each layer of the single epitaxial layer stack, and the plurality of epitaxial layers of the detector epitaxial stack may consist essentially of a second portion of each layer of a bottommost subset of the single epitaxial layer stack. In some embodiments, this may be reversed, with a topmost epitaxial layer of the emitter epitaxial layer stack 940 being disposed closer to the semiconductor substrate 901 than the topmost epitaxial layer of the detector epitaxial layer stack.

As illustrated in FIG. 9, In some embodiments, the detector epitaxial stack includes the following layers:
(i) a first contact layer disposed over the semiconductor substrate and comprising an intentionally highly doped III-V semiconductor layer including p-type or n-type dopants;
(ii) a III-V undoped barrier layer disposed over the first contact layer and configured to block flow of majority carriers of a same type as the dopants and to allow flow of minority carriers of a type opposite from the majority carriers;
(iii) a light absorber layer disposed over the III-V undoped barrier layer and comprising a lightly doped III-V semiconductor layer including dopants of a same type as the dopants of the first contact layer; and
(iv) a second contact layer disposed over the light absorber layer and comprising a second highly doped III-V semiconductor layer including p-type or n-type dopants.

In a unipolar barrier device, the first and second contact layers and the light absorber layer all include the same type of dopants. In a tunnel junction device, on the other hand, the first and second contact layers include different types of dopants.

In some embodiments, the optical device may include a PIN detector. Then, the epitaxial stack includes the following layers:
(i) a first contact layer comprising an intentionally highly doped III-V semiconductor layer including p-type or n-type dopants;
(ii) an light absorber layer comprising an undoped III-V semiconductor layer; and
(iii) a second contact layer comprising a second highly doped III-V semiconductor layer including p-type or n-type dopants.

In PIN devices, the first and second contact layers in include different types of dopants.

In some embodiments, the emitter epitaxial layer stack includes an active region comprising a III-V semiconductor layer stack including a III-V semiconductor alloy layer disposed between two III-V semiconductor alloy layers of a different composition, with the active region being configured to generate light by recombination and/or relaxation. An example of the active region, where light generation is achieved by inter-subband relaxation can include the following III-V layer sequence: 1.4 nm $Al_{0.635}In_{365}As$/3.5 nm $Ga_{0.4}In_{0.6}As$/1.6 nm $Al_{0.635}In_{365}As$/3.4 nm $Ga_{0.4}In_{0.6}As$/0.6 nm $Al_{0.635}In_{0.365}As$/0.45 nm $AlAs$/1.2 nm $Al_{0.635}In_{365}As$/1.4 nm $Ga_{0.4}In_{0.6}As$/1.3 nm $Al_{0.635}In_{0.365}As$/2.7 nm $Ga_{0.4}In_{0.6}As$/1.05 nm $Al_{0.635}In_{365}As$/5.6 nm $Ga_{0.4}In_{0.6}As$/1.1 nm $Al_{0.635}In_{365}As$/4.9 nm $Ga_{0.4}In_{0.6}As$/1.3 $Al_{0.635}In_{0.365}As$/4.5 nm $Ga_{0.4}In_{0.6}As$. This layer sequence forms minibands in the conduction band, between which electron relaxes radiatively, emitting a photon with an energy, corresponding to 8 μm emission wavelength. See Vizbaras, et al., "Short-Injector Quantum Cascade Laser Emitting at 8-μm Wavelength with High Slope Efficiency," *IEEE Photonics Technology Letters*, Vol. 21, No. 19 (October 2009) 1384-1386, incorporated herein by reference in its entirety. In order to provide sufficient gain, such layer stack may be repeated 64 times. The abovementioned description of the 2200 nm light emitter with two quantum wells provides an active region example, where light is generated by interband recombination.

The example of a complementary device, shown in FIG. 9 can be processed by standard III-V fabrication techniques. As is well-known to a person skilled in the art, one can first perform lithography steps, covering the emitter side and exposing epitaxial layers of the detector side. Then, the emitter layers down to the detector contact layer can be removed, e.g., etched chemically or by reactive ion etching. Additional lithographic steps and etching steps can then be used to structure the contact ring, structure the light emitter mesa, and deposit and pattern a dielectric coating and metal layers, to define a fully functioning monolithic, complementary device.

Figure 10:
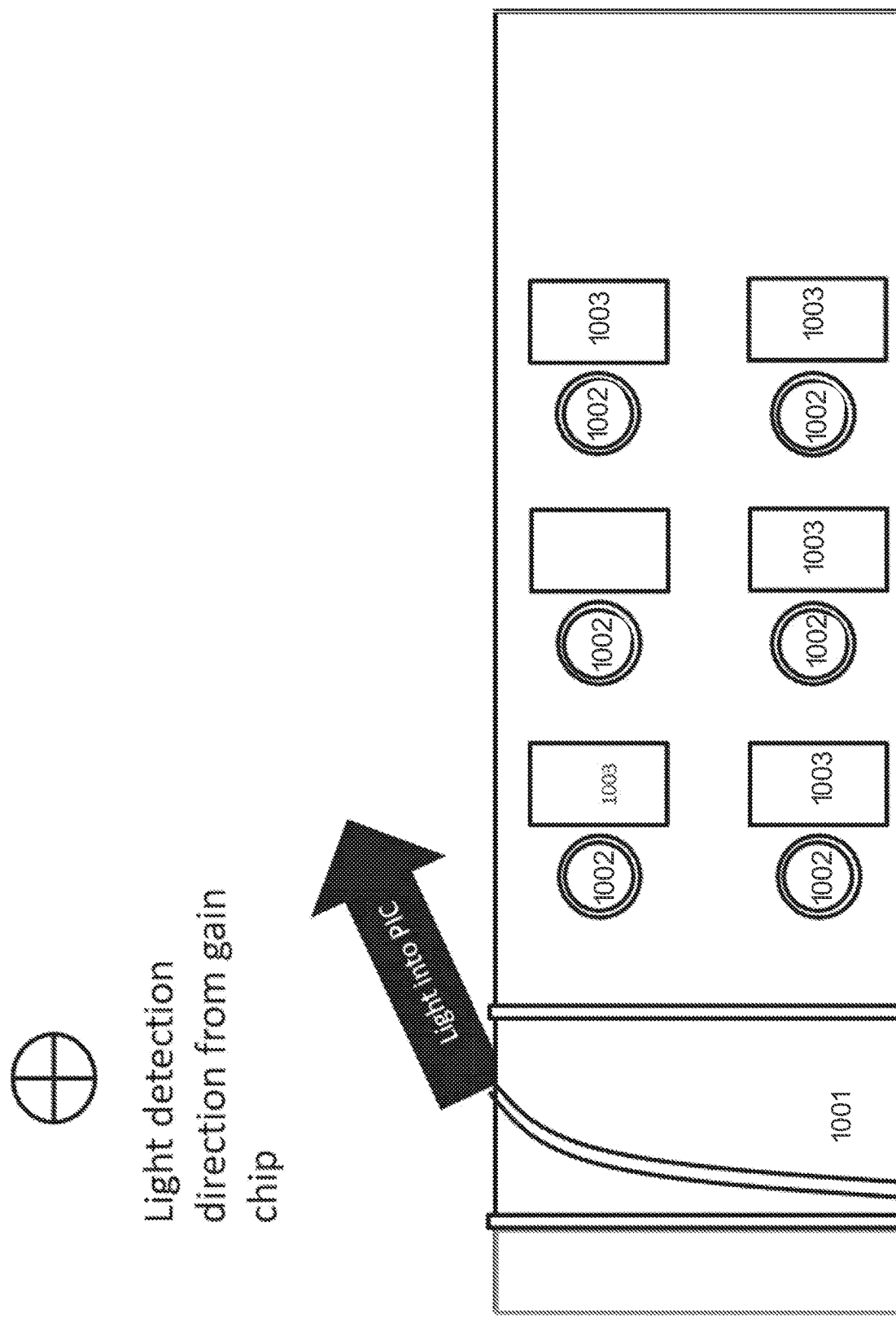
FIG. 10 is a schematic top view of a complementary III-V chip, in which a light emitter is a bent-ridge-waveguide gain chip and the signal detector array is formed from six circular photodetectors, realized during the same fabrication run, in accordance with an embodiment of the invention.

FIG. 10 illustrates a top view of a singulated III-V complementary chip with a bent-ridge-waveguide light emitter 1001 and an array of 6 circular photo detectors 1002 with contact pads 1003.

In practice, detector mesas and contact pads can be of any desired shape, not limited to circular or rectangular.

Figure 11A:
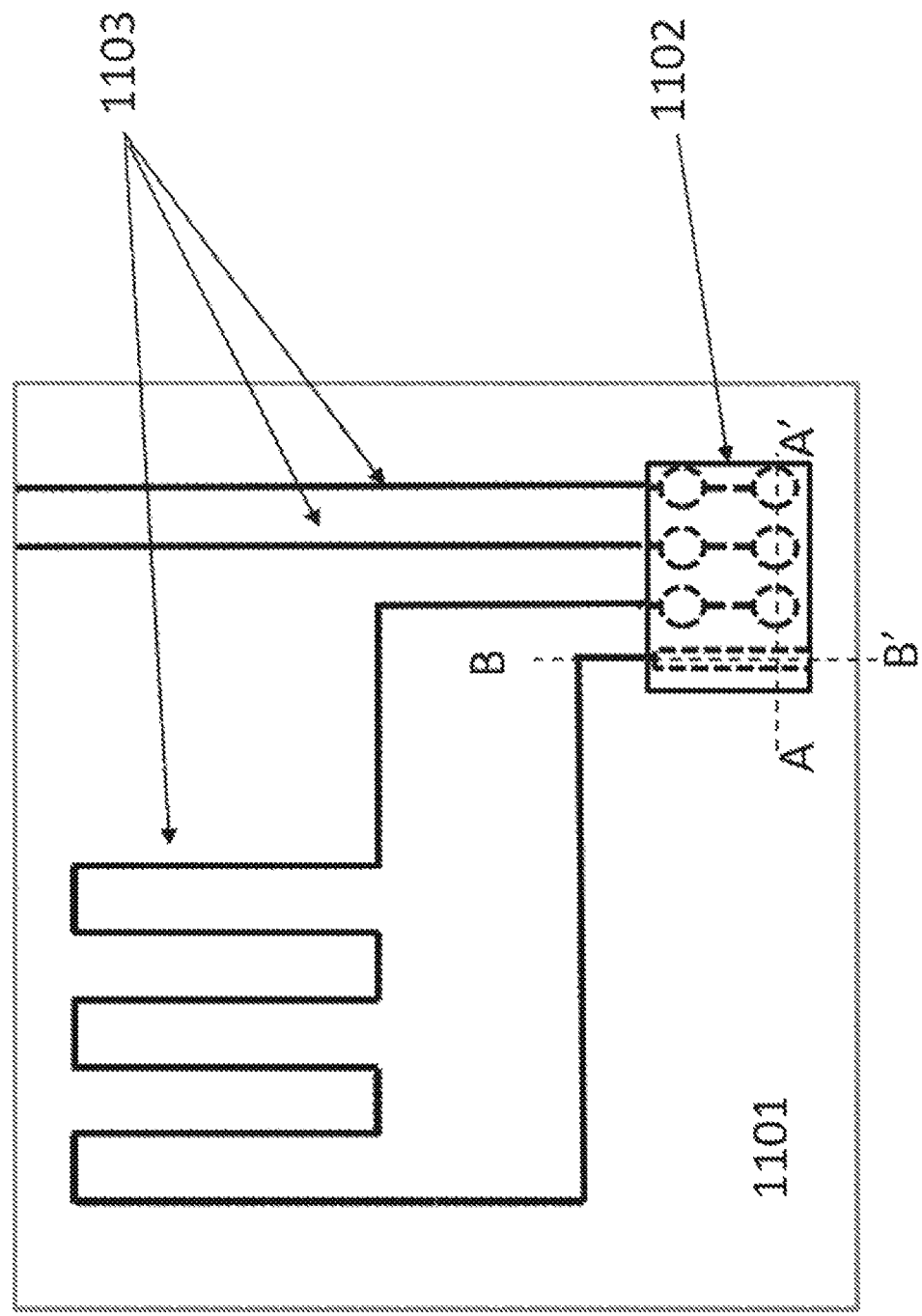
FIG. 11a is a schematic top view of the complementary III-V chip of FIG. 10, integrated into group-IV photonic integrated circuit, in accordance with an embodiment of the invention.
Figure 11B:
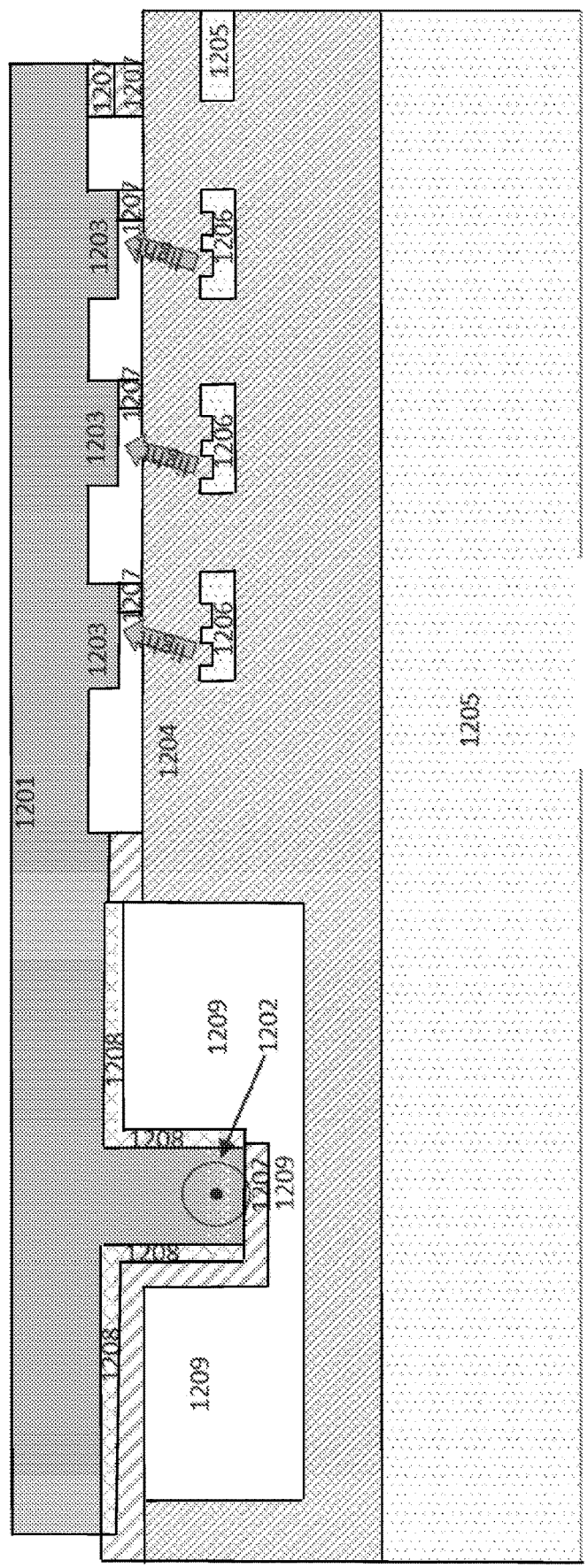
FIG. 11b is a cross-sectional view of a complementary III-V chip integrated into a silicon photonic integrated circuit, illustrating light detection and emission (circle with a dot, showing emission direction) in the hybrid structure, in accordance with an embodiment of the invention.
Figure 11C:
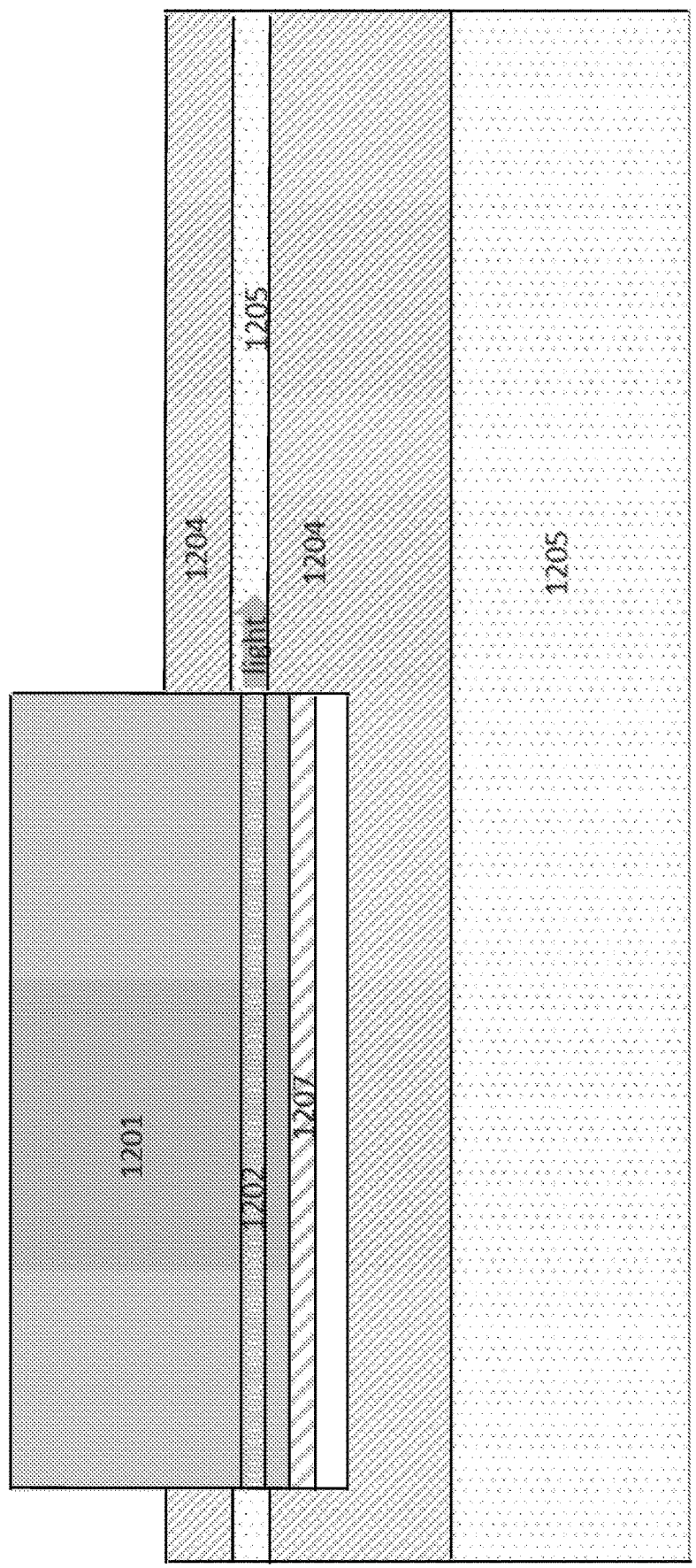
FIG. 11c is a second cross-sectional view of the complementary III-V chip integrated in the silicon photonic integrated circuit, illustrating light coupling in the waveguiding structures of the integrated circuit, in accordance with an embodiment of the invention.

Referring to FIGS. 11a-11c, a possible hybrid integration scenario. Includes a group-IV integrated circuit made on an SOI platform, with a buried oxide (BOX) layer and the waveguiding of light performed via silicon waveguides. In general, the routing of light from an emitter can be done, for example, with any group-IV photonic integrated circuit, where the group-IV platform may be, e.g., Si, SOI, Ge, and/or GOI platforms etc.

In particular, FIG. 11a shows the top-side schematic view of the III-V complementary chip 1102 integrated into silicon photonics integrated circuit (1101). The black lines 1103 connecting the two—represent silicon waveguides for guiding light. AA' and BB' represent specific cuts that are depicted in detail in FIGS. 11b and 11c, respectively. The cut, represented in FIG. 11b, illustrates a key aspect of embodiments of the invention. Here, one can see the complementary III-V device, realized on the same, e.g., GaSb substrate 1201, with the photodetector structure grown first, on top of which a light emitting structure is realized in the same process. In FIG. 11b, photodetector mesas 1203 and light emitter active region 1202, where light generation takes place, are depicted. Light, generated in the active region is emitted perpendicular to the image plane and is detected (coupled into detectors 1203) in an in-plane configuration with the figure. The following features are indicated: Si material 1205 (substrate and waveguides), silicon oxide layer 1204 (buried and top), functional structures 1206, such as grating couplers, that allow outcoupling light from the photonic integrated circuit into photodetector, depicted as arrows, metal contact pads 1207, a schematic representation of electrical isolation 1208, which isolates light emitters contacts, and a special trench 1209, etched into the photonic integrated circuit to allow flip-chipping of the III-V structure.

FIG. 11c depicts the BB' cut, where the all the markings are same as in FIG. 11b, with the III-V complementary chip 1201 on the same substrate (with all the heterolayers), active region 1202 where light is emitted, the silicon oxide 1204, silicon 1205 and metallization 1207.

The described embodiments of the invention are intended to be merely exemplary and numerous variations and modifications are intended to be within the scope of the present invention as defined in the appended claims.

The invention claimed is:

1. A solid-state device comprising:
    a semiconductor substrate;
    a solid-state light emitter disposed over the semiconductor substrate, the solid-state light emitter configured to emit light with a beam propagation direction;
    a solid-state light routing medium in optical communication with the solid-state light emitter; and
    a solid-state light detector disposed over the semiconductor substrate in optical communication with the light routing medium and configured to detect light emitted by the solid-state light emitter,
    wherein (i) the solid-state light emitter and solid-state light detector are both monolithically formed on the substrate, (ii) the solid-state light emitter comprises an emitter epitaxial layer stack and the solid-state light detector comprises a detector epitaxial layer stack, (iii) each of the emitter epitaxial layer stack and the detector epitaxial layer stack comprises a different plurality of epitaxial layers of a single epitaxial layer stack disposed over the semiconductor substrate, and (iv) the beam propagation direction is (a) in-plane with the single epitaxial layer stack and the solid-state light detector detects light out of plane with the single epitaxial layer stack, or (b) out of plane with the single epitaxial layer stack and the solid-state light detector detects light in plane with the single epitaxial layer stack.

2. The solid-state device of claim 1, wherein a topmost epitaxial layer of the detector epitaxial stack is disposed closer to the semiconductor substrate than a topmost epitaxial layer of the emitter epitaxial layer stack.

3. The solid-state device of claim 1, wherein (i) the plurality of epitaxial layers of the emitter epitaxial layer stack comprises a first portion of each layer of the single epitaxial layer stack and (ii) the plurality of epitaxial layers of the detector epitaxial stack consists essentially of a second portion of each layer of a bottommost subset of the single epitaxial layer stack.

4. The solid-state device of claim 1, wherein a topmost epitaxial layer of the emitter epitaxial layer stack is disposed closer to the semiconductor substrate than a topmost epitaxial layer of the detector epitaxial layer stack.

5. The solid-state device of claim 4, wherein (i) the plurality of epitaxial layers of the detector epitaxial layer stack comprises a first portion of each layer of the single epitaxial layer stack and (ii) the plurality of epitaxial layers of the emitter epitaxial layer stack consists essentially of a second portion of each layer of a bottommost subset of the single epitaxial layer stack.

6. The solid-state device of claim 1, wherein the semiconductor substrate, the solid-state light emitter, and the solid-state light detector each comprises III-V semiconductor material.

7. The solid-state device of claim 6, wherein the III-V semiconductor material comprises at least one of Al, Ga, In, As, Sb, P, N, Bi, or alloy combinations thereof.

8. The solid-state device of claim 6, wherein the III-V semiconductor material comprises at least one dopant for electrical conductivity.

9. The solid-state device of claim 1, wherein the single epitaxial layer stack comprises a thickness matching layer.

10. The solid-state device of claim 9, wherein the thickness matching layer is disposed above a topmost layer of the emitter epitaxial layer stack or a topmost layer of the detector epitaxial layer stack.

11. The solid-state device of claim 1, wherein the light routing medium comprises at least one group IV element.

12. A solid-state device, comprising:
    a semiconductor substrate;
    a solid-state light emitter disposed over the semiconductor substrate, the solid-state light emitter configured to emit light with a beam propagation direction;
    a light routing medium in optical communication with the solid-state light emitter; and
    a solid-state light detector disposed over the semiconductor substrate in optical communication with the light routing medium and configured to detect light emitted by the solid-state light emitter,
    wherein (i) the solid-state light emitter and solid-state light detector are both monolithically formed on the substrate, (ii) the solid-state light emitter comprises an emitter epitaxial layer stack and the solid-state light detector comprises a detector epitaxial layer stack, (iii) each of the emitter epitaxial layer stack and the detector epitaxial layer stack comprises a different plurality of epitaxial layers of a single epitaxial layer stack disposed over the semiconductor substrate, and (iv) the beam propagation direction is (a) in-plane with the single epitaxial layer stack and the solid-state light detector detects light out of plane with the single epitaxial layer stack, or (b) out of plane with the single epitaxial layer stack and the solid-state light detector detects light in plane with the single epitaxial layer stack, and wherein the detector epitaxial layer stack comprises:
a first contact layer disposed over the semiconductor substrate and comprising an intentionally highly doped III-V semiconductor layer including p-type or n-type dopants;
a III-V undoped barrier layer disposed over the first contact layer and configured to block flow of majority carriers of a same type as the dopants and to allow flow of minority carriers of a type opposite from the majority carriers;
a light absorber layer disposed over the III-V undoped barrier layer and comprising a lightly doped III-V semiconductor layer including dopants of a same type as the dopants of the first contact layer; and
a second contact layer disposed over the light absorber layer and comprising a second highly doped III-V semiconductor layer including p-type or n-type dopants.

13. The solid-state device of claim 12, wherein the first and second contact layers include a same type of dopants.

14. The solid-state device of claim 12, wherein the first and second contact layers include different types of dopants.

15. A solid-state device, comprising:
a semiconductor substrate;
a solid-state light emitter disposed over the semiconductor substrate, the solid-state light emitter configured to emit light with a beam propagation direction;
a light routing medium in optical communication with the solid-state light emitter; and
a solid-state light detector disposed over the semiconductor substrate in optical communication with the light routing medium and configured to detect light emitted by the solid-state light emitter,
wherein (i) the solid-state light emitter and solid-state light detector are both monolithically formed on the substrate, (ii) the solid-state light emitter comprises an emitter epitaxial layer stack and the solid-state light detector comprises a detector epitaxial layer stack, (iii) each of the emitter epitaxial layer stack and the detector epitaxial layer stack comprises a different plurality of epitaxial layers of a single epitaxial layer stack disposed over the semiconductor substrate, and (iv) the beam propagation direction is (a) in-plane with the single epitaxial layer stack and the solid-state light detector detects light out of plane with the single epitaxial layer stack, or (b) out of plane with the single epitaxial layer stack and the solid-state light detector detects light in plane with the single epitaxial layer stack, and
wherein the detector epitaxial layer stack comprises:
a first contact layer comprising an intentionally highly doped III-V semiconductor layer including p-type or n-type dopants;
an light absorber layer comprising an undoped III-V semiconductor layer; and
a second contact layer comprising a second highly doped III-V semiconductor layer including p-type or n-type dopants.

16. The solid-state device of claim 15, wherein the first and second contact layers include different types of dopants.

17. A solid-state device comprising
a semiconductor substrate;
a solid-state light emitter disposed over the semiconductor substrate, the solid-state light emitter configured to emit light with a beam propagation direction;
a light routing medium in optical communication with the solid-state light emitter; and
a solid-state light detector disposed over the semiconductor substrate in optical communication with the light routing medium and configured to detect light emitted by the solid-state light emitter,
wherein (i) the solid-state light emitter and solid-state light detector are both monolithically formed on the substrate, (ii) the solid-state light emitter comprises an emitter epitaxial layer stack and the solid-state light detector comprises a detector epitaxial layer stack, (iii) each of the emitter epitaxial layer stack and the detector epitaxial layer stack comprises a different plurality of epitaxial layers of a single epitaxial layer stack disposed over the semiconductor substrate, and (iv) the beam propagation direction is (a) in-plane with the single epitaxial layer stack and the solid-state light detector detects light out of plane with the single epitaxial layer stack, or (b) out of plane with the single epitaxial layer stack and the solid-state light detector detects light in plane with the single epitaxial layer stack, and
wherein the emitter epitaxial layer stack comprises an active region comprising a III-V semiconductor layer stack including a III-V semiconductor alloy layer disposed between two III-V semiconductor alloy layers of a different composition, wherein the active region is configured to generate light by at least one of recombination or relaxation.

18. A solid-state device comprising:
a semiconductor substrate;
a solid-state light emitter disposed over the semiconductor substrate, the solid-state light emitter configured to emit light with a beam propagation direction;
a light routing medium in optical communication with the solid-state light emitter; and
a solid-state light detector disposed over the semiconductor substrate in optical communication with the light routing medium and configured to detect light emitted by the solid-state light emitter,
wherein (i) the solid-state light emitter and solid-state light detector are both monolithically formed on the substrate, (ii) the solid-state light emitter comprises an emitter epitaxial layer stack and the solid-state light detector comprises a detector epitaxial layer stack, (iii) each of the emitter epitaxial layer stack and the detector epitaxial layer stack comprises a different plurality of epitaxial layers of a single epitaxial layer stack disposed over the semiconductor substrate, and (iv) the beam propagation direction is (a) in-plane with the single epitaxial layer stack and the solid-state light detector detects light out of plane with the single epitaxial layer stack, or (b) out of plane with the single epitaxial layer stack and the solid-state light detector detects light in plane with the single epitaxial layer stack, and
wherein (iv) the semiconductor substrate is a III-V semiconductor substrate, (v) the semiconductor substrate is at least one of intentionally undoped, semi-insulating, or electrically conductive and doped with p- or n-type impurities, and (vi) the single epitaxial layer stack comprises a III-V semiconductor graded layer comprising at least one of compositional grading or dopant concentration grading.

19. The solid-state device of claim 18, wherein the III-V semiconductor graded layer provides smooth conductance and valence band transition to an adjacent layer.

20. A method for detecting light in a solid-state device, the method comprising:

emitting a light beam by a solid-state light emitter; and propagating the light through a solid-state light routing medium to a solid-state light detector, wherein (i) the solid-state light emitter and solid-state light detector are both monolithically formed on a substrate, (ii) the solid-state light emitter comprises an emitter epitaxial layer stack and the solid-state light detector comprises a detector epitaxial layer stack, (iii) each of the emitter epitaxial layer stack and the detector epitaxial layer stack comprises a different plurality of epitaxial layers of a single epitaxial layer stack disposed over the semiconductor substrate, and (iv) the beam propagation direction is (a) in-plane with the single epitaxial layer stack and the solid-state light detector detects light out of plane with the single epitaxial layer stack, or (b) out of plane with the single epitaxial layer stack and the solid-state light detector detects light in plane with the single epitaxial layer stack.

21. A method of forming a solid-state device, the method comprising:

forming a single epitaxial layer stack over a semiconductor substrate;

monolithically forming a solid-state light emitter and solid-state light detector on the semiconductor substrate from the single epitaxial layer stack, the solid-state light emitter comprising an emitter epitaxial layer stack and the solid-state light detector comprising a detector epitaxial layer stack, with each of the emitter epitaxial layer stack and the detector epitaxial layer stack comprises a different plurality of epitaxial layers of the single epitaxial layer stack; and forming a solid-state light routing medium in optical communication with the solid-state light emitter and solid-state light detector, wherein (i) the solid-state light emitter is configured to emit light with a beam propagation direction, (ii) the solid-state light detector is configured to detect light emitted by the solid-state light emitter, and (iii) the beam propagation direction is (a) in-plane with the single epitaxial layer stack and the solid-state light detector detects light out of plane with the single epitaxial layer stack, or (b) out of plane with the single epitaxial layer stack and the solid-state light detector detects light in plane with the single epitaxial layer stack.

* * * * *